(12) United States Patent
Sun et al.

(10) Patent No.: US 12,250,793 B2
(45) Date of Patent: Mar. 11, 2025

(54) MOBILE TERMINAL

(71) Applicant: Huawei Technologies Co., Ltd., Shenzhen (CN)

(72) Inventors: Siqiang Sun, Shanghai (CN); Yameng Wei, Shenzhen (CN); Xiyong Xu, Shenzhen (CN)

(73) Assignee: HUAWEI TECHNOLOIGES CO., LTD., Shenzhen (CN)

( * ) Notice: Subject to any disclaimer, the term of this patent is extended or adjusted under 35 U.S.C. 154(b) by 149 days.

(21) Appl. No.: 17/920,519

(22) PCT Filed: Mar. 24, 2021

(86) PCT No.: PCT/CN2021/082500
§ 371 (c)(1),
(2) Date: Oct. 21, 2022

(87) PCT Pub. No.: WO2021/213118
PCT Pub. Date: Oct. 28, 2021

(65) Prior Publication Data
US 2023/0200021 A1   Jun. 22, 2023

(30) Foreign Application Priority Data
Apr. 23, 2020   (CN) .......................... 202010328027.9

(51) Int. Cl.
*H05K 7/20* (2006.01)

(52) U.S. Cl.
CPC .................. *H05K 7/205* (2013.01)

(58) Field of Classification Search
CPC .. H05K 7/205; H05K 7/20445; H05K 7/1427; H05K 7/20518; G06F 1/203
See application file for complete search history.

(56) References Cited

U.S. PATENT DOCUMENTS

| 2008/0158817 A1 | 7/2008 | Tsunoda et al. |
| 2015/0055300 A1 | 2/2015 | Hsieh et al. |

(Continued)

FOREIGN PATENT DOCUMENTS

| CN | 101461058 A | 6/2009 |
| CN | 202603124 U | 12/2012 |

(Continued)

OTHER PUBLICATIONS

Zheng Hongwei; Xue Bingnan; Chen Qiang, "Grooved heat insulation board", Jul. 24, 2013, Jiangsu Huahao New Energy Technology Co Ltd, Entire Document (Translation of CN 203080716). (Year: 2013).*

(Continued)

*Primary Examiner* — Stephen S Sul

(74) *Attorney, Agent, or Firm* — Conley Rose, P.C.

(57) ABSTRACT

A mobile terminal includes a main board, a heat dissipation layer, a first support, and a housing that are sequentially stacked. A heat generation element is disposed on the main board, and an orthographic projection of the heat generation element on the housing is located in an orthographic projection of the first support on the housing. The heat dissipation layer is disposed in contact with the heat generation element, and an area of an orthographic projection of the heat dissipation layer on the housing is larger than an area of the orthographic projection of the first support on the housing.

20 Claims, 5 Drawing Sheets

(56) References Cited

U.S. PATENT DOCUMENTS

| | | |
|---|---|---|
| 2015/0208550 A1 | 7/2015 | Rugg |
| 2017/0098592 A1 | 4/2017 | Jin et al. |
| 2017/0155746 A1* | 6/2017 | Yang ............... G06F 1/203 |
| 2017/0238442 A1 | 8/2017 | Zhang |
| 2018/0007181 A1* | 1/2018 | Lee ............... H05K 9/0032 |
| 2018/0368284 A1 | 12/2018 | Yang |
| 2019/0360766 A1* | 11/2019 | Kenney ............ F28F 3/027 |
| 2020/0021005 A1* | 1/2020 | Kosaka ............ H01Q 1/42 |
| 2021/0045257 A1 | 2/2021 | Wu |
| 2021/0161039 A1* | 5/2021 | Jung ............ H05K 1/0203 |
| 2023/0200021 A1 | 6/2023 | Sun |

FOREIGN PATENT DOCUMENTS

| | | |
|---|---|---|
| CN | 203080716 U | 7/2013 |
| CN | 203691838 U | 7/2014 |
| CN | 104813760 A | 7/2015 |
| CN | 204993472 U | 1/2016 |
| CN | 105472940 A | 4/2016 |
| CN | 205284011 U | 6/2016 |
| CN | 206506813 U | 9/2017 |
| CN | 107249283 A | 10/2017 |
| CN | 206916980 U | 1/2018 |
| CN | 107708291 A * | 2/2018 |
| CN | 207075161 U | 3/2018 |
| CN | 207124842 U | 3/2018 |
| CN | 108207097 A | 6/2018 |
| CN | 108776531 A | 11/2018 |
| CN | 109151139 A | 1/2019 |
| CN | 209563090 U | 10/2019 |
| CN | 110691156 A | 1/2020 |
| CN | 111372433 A | 7/2020 |
| EP | 3248218 B1 | 9/2019 |
| WO | 2007029311 A1 | 3/2007 |

OTHER PUBLICATIONS

Huang Zhanken, "Printed circuit board and mobile terminal", Feb. 16, 2018, Guangdong Oppo Mobile Telecommunications Corp Ltd, Entire Document (Translation of CN 107708291). (Year: 2018).*

* cited by examiner thermally conductive material

MOBILE TERMINAL

CROSS-REFERENCE TO RELATED APPLICATIONS

This is a U.S. National Stage of International Patent Application No. PCT/CN2021/082500 filed on Mar. 24, 2021, which claims priority to Chinese Patent Application No. 202010328027.9 filed on Apr. 23, 2020. Both of the aforementioned applications are hereby incorporated by reference in their entireties.

TECHNICAL FIELD

This application relates to the field of electronic product technologies, and in particular, to a mobile terminal.

BACKGROUND

As a next-generation portable communications device, a mobile terminal is widely popularized because the mobile terminal has advantages such as a small size and diversified functions. With rapid development of science and technology and a pursuit of people for increasingly high living standards, functions of the mobile terminal are continuously enriched and improved, and hardware has increasingly high performance.

As the performance of the hardware is improved, a signal transmission capability of an antenna and a pixel level of a camera are continuously improved. Therefore, in a process of using the mobile terminal, the antenna and the camera generate a large amount of heat. Consequently, there is an excessively high temperature at positions, in a housing of the terminal, corresponding to the antenna and the camera, degrading user experience.

SUMMARY

This application provides a mobile terminal, to avoid a problem that there is an excessively high temperature in a part of a housing.

According to a first aspect, a mobile terminal is provided, and includes a main board, a heat dissipation layer, a first support, and a housing that are sequentially stacked.

A heat generation element is disposed on the main board, and an orthographic projection of the heat generation element on the housing is located in an orthographic projection of the first support on the housing.

The heat dissipation layer is disposed in contact with the heat generation element, and an area of an orthographic projection of the heat dissipation layer on the housing is larger than an area of the orthographic projection of the first support on the housing.

In the mobile terminal provided in this application, the heat generation component is disposed on the main board, the heat dissipation layer is disposed on a side that is of the heat generation component and that faces away from the main board, and is disposed in contact with the heat generation component, the first support and the housing are sequentially disposed on a side that is of the heat dissipation layer and that faces away from the main board, and the area of the orthographic projection of the heat dissipation layer on the housing is larger than the area of the orthographic projection of the first support on the housing. In a working process of the mobile terminal, the heat generation component generates heat. The heat dissipation layer is disposed in contact with the heat generation component, and therefore the heat generated by the heat generation component is quickly conducted to the heat dissipation layer through heat conduction. The heat is conducted at the heat dissipation layer along a plane on which the heat dissipation layer is located, and then transferred to the housing. In addition, the heat at the heat dissipation layer may be further transferred to the first support, and then transferred from the first support to a position corresponding to the first support in the housing. The area of the orthographic projection of the heat dissipation layer on the housing is larger than the area of the orthographic projection of the first support on the housing, in other words, an area of the heat dissipation layer is larger than an area of the first support. Therefore, when the heat generated by the heat generation element is transferred to the heat dissipation layer, the heat dissipation layer dissipates the heat, and accordingly heat transferred to the first support is effectively reduced. In this way, a temperature at a position corresponding to the heat generation element in the housing is reduced, and therefore a problem that there is an excessively high temperature in a part of the housing is avoided, and user experience is improved.

In a possible implementation, a first groove is disposed on at least one of a surface that is of the first support and that faces the heat dissipation layer and a surface that is of the first support and that faces away from the heat dissipation layer.

The first groove is disposed, to reduce heat transfer efficiency between the heat generation element and a part corresponding to the heat generation element in the housing.

In a possible implementation, a plurality of first grooves are disposed on the surface that is of the first support and that faces the heat dissipation layer, and every two adjacent first grooves are disposed in parallel; and/or a plurality of first grooves are disposed on the surface that is of the first support and that faces away from the heat dissipation layer, and every two adjacent first grooves are disposed in parallel.

The plurality of first grooves are disposed, to further reduce the heat transfer efficiency between the heat generation element and the part corresponding to the heat generation element in the housing.

In a possible implementation, the first groove includes a first sub-groove and a second sub-groove; and the first sub-groove is disposed on the surface that is of the first support and that faces the heat dissipation layer, the second sub-groove is disposed on the surface that is of the first support and that faces away from the heat dissipation layer, and the first sub-groove and the second sub-groove are disposed in a staggered manner.

In a possible implementation, the first groove includes a first sub-groove and a second sub-groove; and the first sub-groove is disposed on the surface that is of the first support and that faces the heat dissipation layer, the second sub-groove is disposed on the surface that is of the first support and that faces away from the heat dissipation layer, and an orthographic projection of the first sub-groove on the housing and an orthographic projection of the second sub-groove on the housing are crosswise arranged.

The first sub-groove is disposed to reduce heat transfer efficiency between the heat generation element and the first support, and the second sub-groove is disposed to reduce heat transfer efficiency between the first support and the housing. In this way, a temperature at the part corresponding to the heat generation element in the housing is effectively reduced, and therefore user experience is improved.

In a possible implementation, a heat insulation material is disposed in the first groove.

The heat insulation material is disposed in the first groove, to further reduce the heat transfer efficiency between the heat generation element and the part corresponding to the heat generation element in the housing, so as to reduce the temperature at the part corresponding to the heat generation element in the housing.

In a possible implementation, the mobile terminal further includes a second support, the second support is disposed on the side that is of the heat dissipation layer and that faces away from the main board, the second support is connected to the heat dissipation layer, and an orthographic projection of the second support on the housing overlaps the orthographic projection of the heat dissipation layer on the housing.

The second support is disposed, to improve efficiency of transferring heat from the heat dissipation layer to the housing, so as to effectively improve a heat dissipation effect of the heat dissipation layer.

In a possible implementation, a second groove is disposed on at least one of a surface that is of the second support and that faces the heat dissipation layer and a surface that is of the second support and that faces away from the heat dissipation layer, and a thermally conductive material is disposed in the second groove.

The thermally conductive material is disposed in both a third sub-groove and a fourth sub-groove, so that the efficiency of transferring heat from the heat dissipation layer to the housing is effectively improved, and heat at the heat dissipation layer corresponding to the heat generation element is further dissipated, to reduce the temperature at the part corresponding to the heat generation element in the housing.

In a possible implementation, the thermally conductive material includes at least one of thermal adhesive, copper foil, and graphite.

In a possible implementation, the second support and the thermally conductive material are integrally formed through injection molding.

In a possible implementation, each of the first support and the second support is of an integrated structure.

In a possible implementation, the heat dissipation layer includes graphite and/or silica gel.

In this application, the heat dissipation layer is disposed in contact with the heat generation element, and the area of the orthographic projection of the heat dissipation layer on the housing is larger than the area of the orthographic projection of the first support on the housing, so that the heat transferred from the heat generation element to the heat dissipation layer can be transferred in a direction in which the heat dissipation layer points to the first support, and can be further transferred along the plane on which the heat dissipation layer is located. Therefore, the heat is dissipated, and accordingly the heat transferred to the first support is effectively reduced. In this way, the temperature at the position corresponding to the heat generation element in the housing is reduced, and therefore a problem that there is an excessively high temperature in a part of the housing is avoided, and user experience is improved.

REFERENCE NUMERALS

1: Main board; 2: Heat generation element; 3: Heat dissipation layer; 4: First support; 41: First groove; 411: First sub-groove; 412: Second sub-groove; 5: Housing; 6: Second support; 61: Second groove; 611: Third sub-groove; and 612: Fourth sub-groove.

DESCRIPTION OF EMBODIMENTS

The terms used in the following embodiments of this application are merely for the purpose of describing specific embodiments, and are not intended to limit this application. The terms "a", "the" and "this" of singular forms used in embodiments and the appended claims of this application are also intended to include plural forms, unless otherwise specified in the context clearly.

It should be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be noted that orientation words such as "up", "down", "left", and "right" described in the embodiments of this application are described from angles shown in the accompanying drawings, and should not be understood as a limitation on the embodiments of this application. In addition, in the context, it should be further understood that when it is mentioned that an element is connected "above" or "below" another element, the element can be directly connected "above" or "below" the another element, or may be indirectly connected "above" or "below" the another element by using an intermediate element.

To improve and enrich functions of a mobile terminal, performance of hardware in the mobile terminal in the conventional technology is increasingly high. Higher performance of the hardware indicates a larger amount of heat generated by the hardware. For example, an antenna and a camera generate a relatively large amount of heat.

As a signal transmission capability of the antenna and a pixel of the camera are continuously improved, in a process of using the mobile terminal, the antenna and the camera generate a relatively large amount of heat. Consequently, there is an excessively high temperature at a position, in a housing 5 of the terminal, corresponding to the antenna and the camera, degrading user experience.

In view of this, the embodiments of this application provide a mobile terminal, to resolve the foregoing technical problem.

Figure 1:
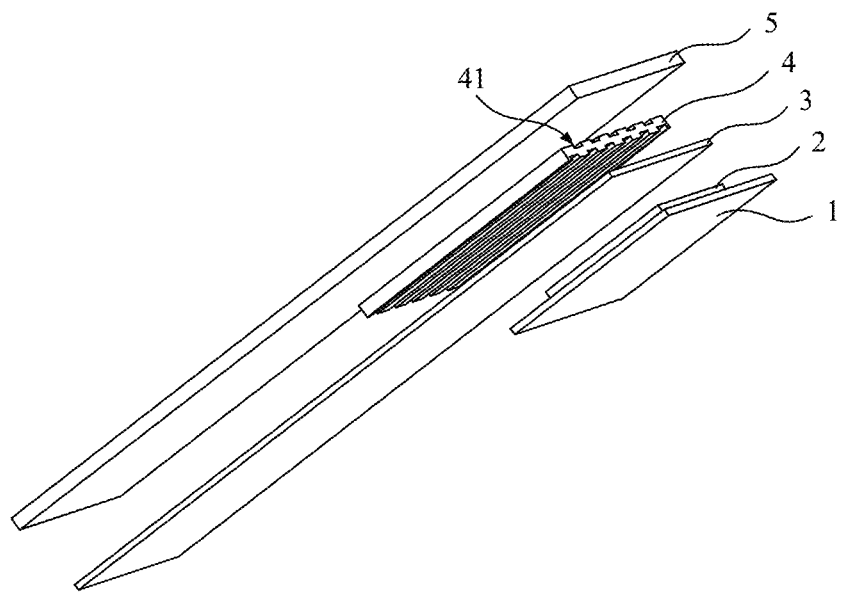
FIG. 1 is a partial exploded diagram of a mobile terminal according to an embodiment of this application.
Figure 2:
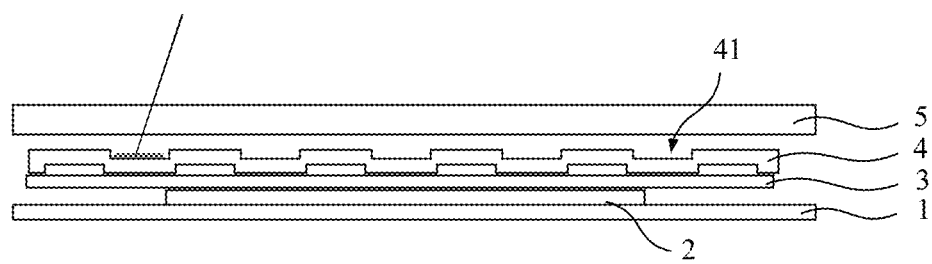
FIG. 2 is a side view of a mobile terminal according to an embodiment of this application.

FIG. 1 is a partial exploded diagram of a mobile terminal according to an embodiment of this application, and FIG. 2 is a side view of a mobile terminal according to an embodiment of this application. As shown in FIG. 1 and FIG. 2, an embodiment of this application provides a mobile terminal. The mobile terminal includes a main board 1, a heat dissipation layer 3, a first support 4, and a housing 5 that are sequentially stacked. A heat generation element 2 is disposed on the main board 1, and an orthographic projection of the heat generation element 2 on the housing 5 is located in an orthographic projection of the first support 4 on the housing 5. The heat dissipation layer 3 is disposed in contact with the heat generation element 2, and an area of an orthographic projection of the heat dissipation layer 3 on the housing 5 is larger than an area of the orthographic projection of the first support 4 on the housing 5.

In the mobile terminal provided in this embodiment of this application, the heat generation component is disposed on the main board 1, the heat dissipation layer 3 is disposed on a side that is of the heat generation component and that faces away from the main board 1, and is disposed in contact with the heat generation component, the first support 4 and the housing 5 are sequentially disposed on a side that is of the heat dissipation layer 3 and that faces away from the main board 1, and the area of the orthographic projection of the heat dissipation layer 3 on the housing 5 is larger than the area of the orthographic projection of the first support 4 on the housing 5. In a working process of the mobile terminal, the heat generation component generates heat. The heat dissipation layer 3 is disposed in contact with the heat generation component, and therefore the heat generated by the heat generation component is quickly conducted to the heat dissipation layer 3 through heat conduction. The heat is conducted at the heat dissipation layer 3 along a plane on which the heat dissipation layer 3 is located. A part of the heat is transferred in a direction far away from the first support 4, and is transferred to another part (for example, the housing 5) of the mobile terminal in a transfer manner of heat radiation or heat conduction, to implement heat dissipation. In addition, the heat at the heat dissipation layer 3 may be further transferred to the first support 4, and then transferred from the first support 4 to a position corresponding to the first support 4 in the housing 5. The area of the orthographic projection of the heat dissipation layer 3 on the housing 5 is larger than the area of the orthographic projection of the first support 4 on the housing 5, in other words, an area of the heat dissipation layer 3 is larger than an area of the first support 4. Therefore, when the heat generated by the heat generation element 2 is transferred to the heat dissipation layer 3, the heat dissipation layer 3 dissipates the heat, and accordingly heat transferred to the first support 4 is effectively reduced. In this way, a temperature at a position corresponding to the heat generation element 2 in the housing 5 is reduced, and therefore a problem that there is an excessively high temperature in a part of the housing 5 is avoided, and user experience is improved.

In addition, in this embodiment of this application, the heat dissipation layer 3, the first support 4, and the housing 5 are sequentially disposed on the side that is of the heat generation component and that faces away from the main board 1. A structure is simple, and this helps implement a light and thin mobile terminal. In addition, the heat dissipation layer 3, the first support 4, and the housing 5 are disposed at different levels. Therefore, an interference problem between the heat dissipation layer 3, the first support 4, and the housing 5 is effectively avoided, to reduce difficulty in manufacturing the mobile terminal.

The heat generation element 2 is an antenna or a camera module, or may be another heat generation device.

The heat dissipation layer 3 is made of a thermally conductive material. In this embodiment of this application, the heat dissipation layer 3 may include graphite and/or silica gel.

The heat dissipation layer 3 is made of a thermally conductive material, to facilitate conduction of heat at the heat dissipation layer 3, so as to improve a heat dissipation effect.

Figure 3:
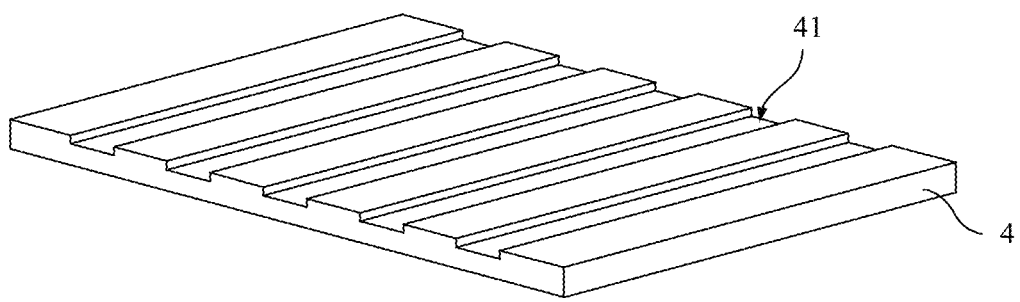
FIG. 3 is a schematic diagram of a structure of a first support according to an embodiment of this application.
Figure 4:
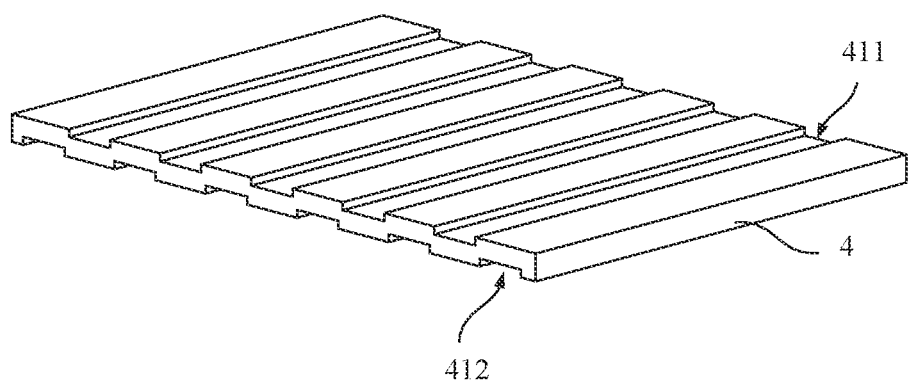
FIG. 4 is a schematic diagram of a structure of another first support according to an embodiment of this application.

FIG. 3 is a schematic diagram of a structure of a first support according to an embodiment of this application, and FIG. 4 is a schematic diagram of a structure of another first support according to an embodiment of this application. As shown in FIG. 3 and FIG. 4, in some embodiments, a first groove 41 is disposed on at least one of a surface that is of the first support 4 and that faces the heat dissipation layer 3 and a surface that is of the first support 4 and that faces away from the heat dissipation layer 3. In addition, a plurality of first grooves 41 are disposed on the surface that is of the first support 4 and that faces the heat dissipation layer 3, and every two adjacent first grooves 41 are disposed in parallel; and/or a plurality of first grooves 41 are disposed on the surface that is of the first support 4 and that faces away from the heat dissipation layer 3, and every two adjacent first grooves 41 are disposed in parallel. As shown in FIG. 3, a plurality of first grooves 41 are evenly disposed on one surface of the first support 4, and every two adjacent first grooves are disposed in parallel. As shown in FIG. 4, the first groove 41 is disposed on each of two opposite surfaces of the first support 4, a plurality of first grooves 41 are evenly disposed on each surface, and every two adjacent first grooves 41 are disposed in parallel.

In the first support 4, the first groove 41 is disposed on a side that is of the first support 4 and that faces the heat dissipation layer 3, and at a position corresponding to the first groove 41 at the heat dissipation layer 3, a heat transfer manner between the heat dissipation layer 3 and the first support 4 is heat radiation; and the first groove 41 is disposed on a side that is of the first support 4 and that faces away from the heat dissipation layer 3, and at a position corresponding to the first groove 41 in the housing 5, a heat transfer manner between the first support 4 and the housing 5 is heat radiation. Heat transfer efficiency existing in the case of heat radiation is lower than that existing in the case of heat conduction. Therefore, the first groove 41 is disposed, to reduce heat transfer efficiency between the heat generation element 2 and a part corresponding to the heat generation element 2 in the housing 5. The heat at the heat dissipation layer 3 is transferred at the heat dissipation layer 3 through heat conduction, and is transferred to a position, in the housing 5, that does not correspond to the heat generation element 2, to improve heat dissipation efficiency of the heat dissipation layer 3, and effectively reduce heat at the part corresponding to the heat generation element 2 in the housing 5.

The first groove 41 includes a first sub-groove 411 and a second sub-groove 412, and the first sub-groove 411 and the second sub-groove 412 are disposed in the following two manners in FIG. 4 and FIG. 5.

As shown in FIG. 4, in some embodiments, a plurality of first sub-grooves 411 are disposed on the surface that is of the first support 4 and that faces the heat dissipation layer 3, and every two adjacent first sub-grooves 411 are disposed in parallel; and a plurality of second sub-grooves 412 are disposed on the surface that is of the first support 4 and that faces away from the heat dissipation layer 3, and every two adjacent second sub-grooves 412 are disposed in parallel. The first sub-groove 411 and the second sub-groove 412 are disposed in a staggered manner.

The first sub-groove 411 is disposed on the side that is of the first support 4 and that faces the heat dissipation layer 3, and the second sub-groove 412 is disposed on the side that is of the first support 4 and that faces away from an edge of the heat dissipation layer 3. The first sub-groove 411 is disposed, so that at a position corresponding to the first sub-groove 411 at the heat dissipation layer 3, a heat transfer manner between the heat dissipation layer 3 and the first support 4 is heat radiation; and the second sub-groove 412 is disposed, so that at a position corresponding to the second sub-groove 412 in the housing 5, a heat transfer manner between the first support 4 and the housing 5 is heat radiation. Heat transfer efficiency existing in the case of heat radiation is lower than that existing in the case of heat conduction. Therefore, the first sub-groove 411 is disposed to reduce heat transfer efficiency between the heat generation element 2 and the first support 4, and the second sub-groove 412 is disposed to reduce heat transfer efficiency between that first support 4 and the housing 5, to effectively reduce the temperature at the part corresponding to the heat generation element 2 in the housing 5, so as to improve user experience.

In addition, that the first sub-groove 411 and the second sub-groove 412 are disposed in a staggered manner may be understood as that in the orthographic projection of the first support 4 on the housing 5, there is an orthographic projection of one second sub-groove 412 between orthographic projections of every two adjacent first sub-grooves 411, and the orthographic projection of the first sub-groove 411 and the orthographic projection of the second sub-groove 412 do not overlap, to ensure strength of the first support 4 and prevent the first support 4 from being deformed.

Figure 5:
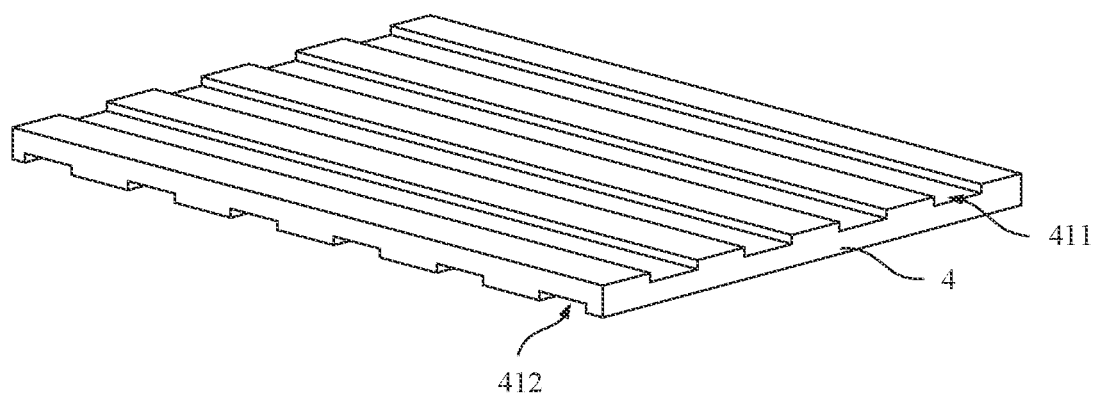
FIG. 5 is a schematic diagram of a structure of still another first support according to an embodiment of this application.

FIG. 5 is a schematic diagram of a structure of still another first support 4 according to an embodiment of this application. As shown in FIG. 5, in some other embodiments, the first sub-groove 411 is disposed on the surface that is of the first support 4 and that faces the heat dissipation layer 3, the second sub-groove 412 is disposed on the surface that is of the first support 4 and that faces away from the heat dissipation layer 3, and an orthographic projection of the first sub-groove 411 on the housing 5 and an orthographic projection of the second sub-groove 412 on the housing 5 are crosswise arranged.

The first sub-groove 411 and the second sub-groove 412 are crosswise arranged, to ensure strength of the first support 4 and prevent the first support 4 from being deformed. In this embodiment of this application, the orthographic projection of the first sub-groove 411 on the housing 5 is perpendicular to the orthographic projection of the second sub-groove 412 on the housing 5, to facilitate manufacturing of the first support 4 and ensure that there is equal strength at all positions of the first support 4.

In some embodiments, a heat insulation material is disposed m the first groove 41.

To further reduce the heat transfer efficiency between the heat generation element 2 and the part corresponding to the heat generation element 2 in the housing 5, the heat insulation material may be disposed in the first groove 41. Heat is transferred at a significantly reduced speed by using the heat insulation material, and therefore the temperature at the part corresponding to the heat generation element 2 in the housing 5 is reduced.

One or more of glass fiber, asbestos, and rock wool may be selected for the heat insulation material.

In some embodiments, a part that is of the heat dissipation layer 3 and that is far away from the first support 4 is directly or indirectly connected to the housing 5. The heat dissipation layer 3 may be of a plate structure or an irregular structure. Therefore, in addition to a part that is in contact with the first support 4, the heat dissipation layer 3 may be partially or completely connected to the housing 5, and a connection manner includes a direct connection manner shown in FIG. 6 and an indirect connection manner shown in FIG. 7.

Figure 6:
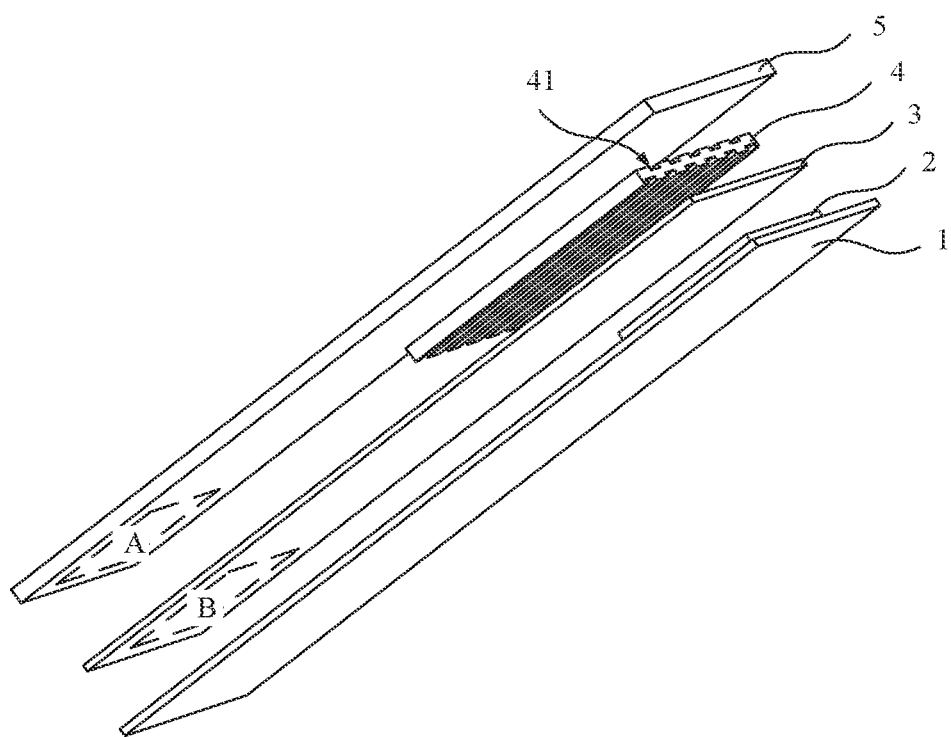
FIG. 6 is a schematic diagram in which a heat dissipation layer is directly connected to a housing according to an embodiment of this application.

FIG. 6 is a schematic diagram in which a heat dissipation layer is directly connected to a housing according to an embodiment of this application. When the heat dissipation layer is of a flexible structure or a non-plate structure, the heat dissipation layer may be directly connected to the housing, to implement heat dissipation. Specifically, as shown in FIG. 6, when the heat dissipation layer is of a flexible structure, the heat dissipation layer may be bent in a direction close to the housing, so that a region B of the heat dissipation layer may be in direct contact with a region A of the housing, to directly connect the heat dissipation layer 3 to the housing 5. Alternatively, when the heat dissipation layer is of a non-plate structure, a region B of the heat dissipation layer may be in direct contact with a region A of the housing after assembly. After being transferred to the region B of the heat dissipation layer, heat is directly conducted to the region A through the region B, so that the heat is transferred from the heat dissipation layer to the housing.

Figure 7:
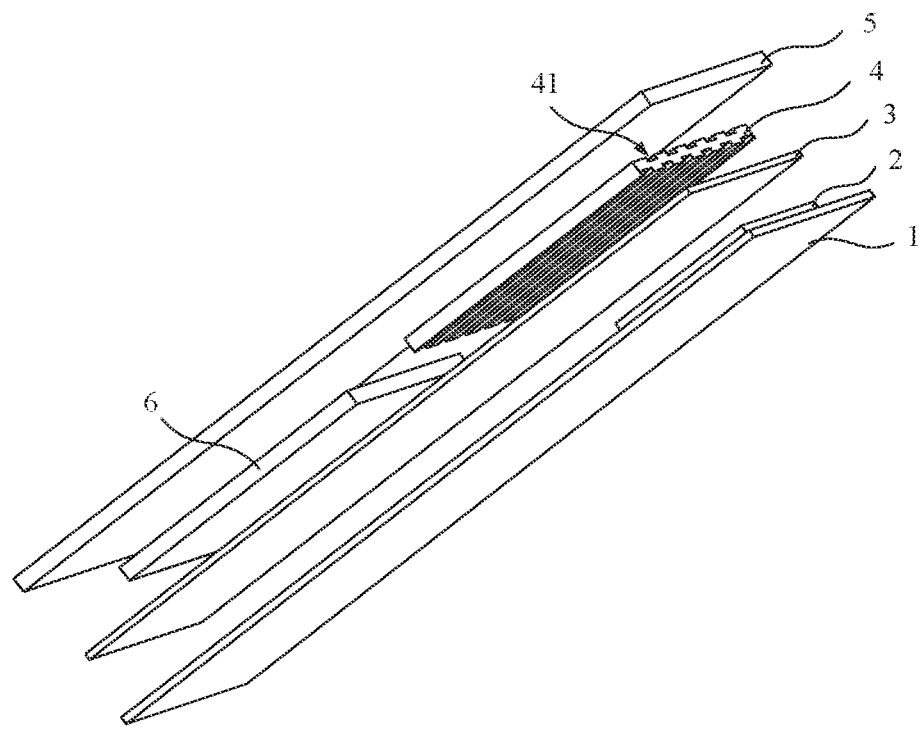
FIG. 7 is a partial exploded diagram of another mobile terminal according to an embodiment of this application.

FIG. 7 is a partial exploded diagram of another mobile terminal according to an embodiment of this application. As shown in FIG. 7, a second support 6 is disposed on the side that is of the heat dissipation layer 3 and that faces away from the main board 1, and the second support 6 is connected to the heat dissipation layer 3, to indirectly connect the heat dissipation layer 3 to the housing 5. An orthographic projection of the second support 6 on the housing 5 overlaps the orthographic projection of the heat dissipation layer 3 on the housing 5. For example, that an orthographic projection of the second support 6 on the housing 5 overlaps the orthographic projection of the heat dissipation layer 3 on the housing 5 may be that the orthographic projection of the second support 6 on the housing 5 may be completely located in the orthographic projection of the heat dissipation layer 3 on the housing 5, or the orthographic projection of the second support 6 on the housing 5 may be partially located in the orthographic projection of the heat dissipation layer 3 on the housing 5.

The second support 6 is disposed, and the second support 6 is connected to the heat dissipation layer 3, to indirectly connect the heat dissipation layer 3 to the housing 5. The heat dissipation layer 3 may transfer the heat to the second support 6 through heat conduction, and then the second support 6 transfers the heat to the housing 5, to implement heat dissipation.

As shown in FIG. 7, the second support 6 may be of a plate-like structure. A material of the second support 6 includes a thermally conductive material, and has a good heat-conducting effect. The heat dissipation layer 3 is connected to the second support 6, so that the heat at the heat dissipation layer 3 may be transferred to the housing 5 through the second support 6.

The second support 6 is disposed to improve efficiency of transferring heat from the heat dissipation layer 3 to the housing 5, and the first groove 41 is disposed on the first support 4 to reduce the heat transfer efficiency between the first support 4 and the housing 5, to effectively improve a heat dissipation effect of the heat dissipation layer 3.

Figure 12:
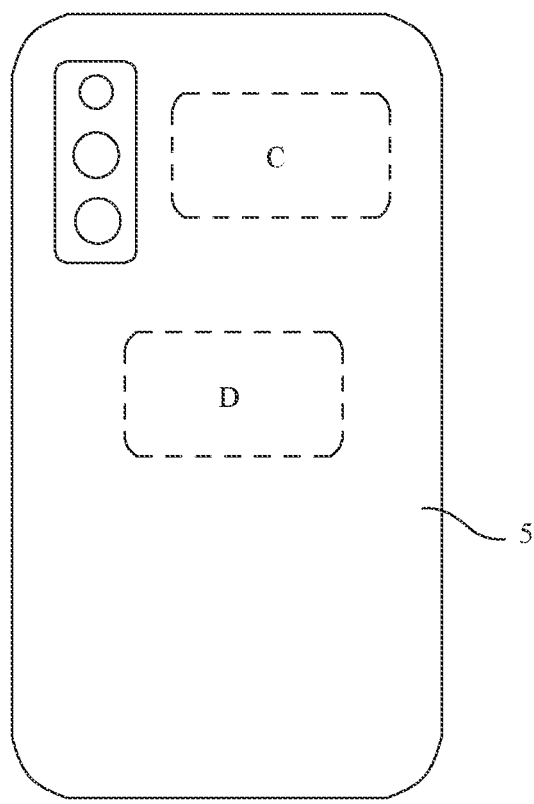
FIG. 12 is a schematic diagram of a structure of a housing according to an embodiment of this application.

FIG. 12 is a schematic diagram of a structure of a housing 5 according to an embodiment of this application. FIG. 12 is used as an example. A region represented by a dashed line box C in the figure is a part corresponding to the first support 4, and a region represented by a dashed line box D is a part corresponding to the second support 6. Heat generated by the heat generation element 2 is mainly dissipated through the region C and the region D, to reduce a temperature in the region C, so as to improve user experience. In addition, a region touched by a user at relatively low frequency may be selected as the region D, to ensure experience of using the mobile terminal by the user when the heat is dissipated through the region D.

In addition, the heat generated by the heat generation element 2 is mainly dissipated through the region C and the region D. Therefore, a heat dissipation area is increased, and heat dissipation efficiency is improved, to effectively avoid a case in which a service life of an electronic component is shortened due to an excessively high temperature in the mobile terminal, so as to protect the electronic component.

Figure 8:
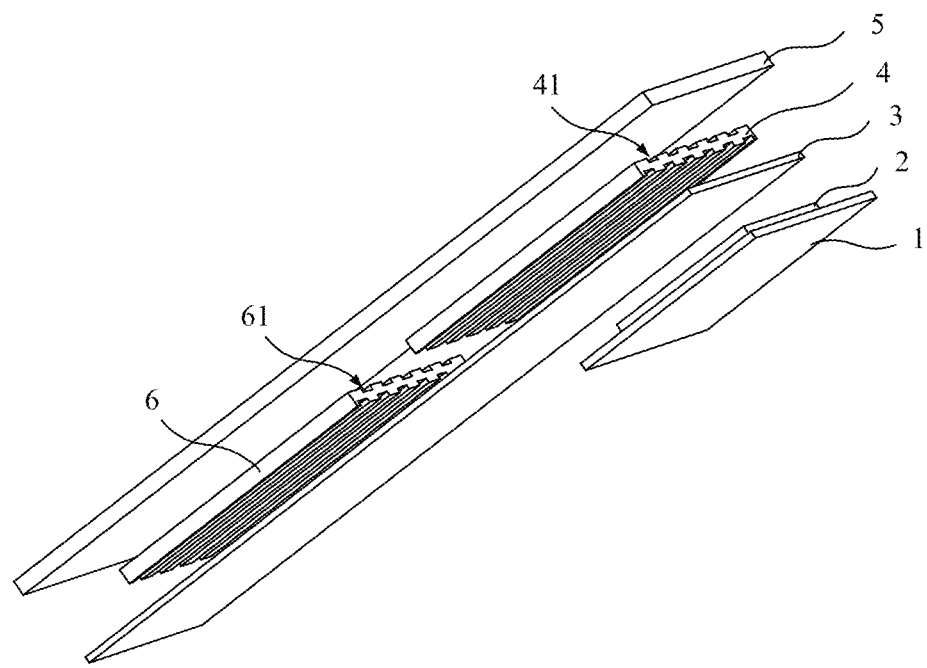
FIG. 8 is a partial exploded diagram of still another mobile terminal according to an embodiment of this application.
Figure 9:
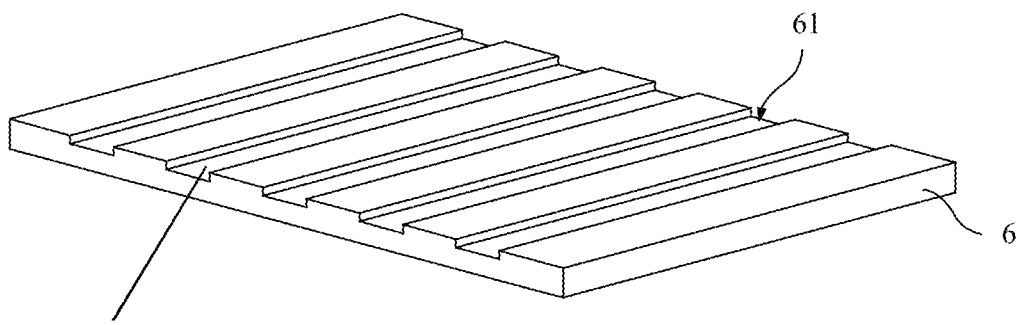
FIG. 9 is a schematic diagram of a structure of a second support according to an embodiment of this application.

FIG. 8 is a partial exploded diagram of still another mobile terminal according to an embodiment of this application, and FIG. 9 is a schematic diagram of a structure of a second support according to an embodiment of this application. As shown in FIG. 8 and FIG. 9, to further improve heat dissipation effect of the heat dissipation layer 3, in some embodiments, a second groove 61 is disposed on at least one of a surface that is of the second support 6 and that faces the heat dissipation layer 3 and a surface that is of the second support 6 and that faces away from the heat dissipation layer 3. As shown in FIG. 8, in the second support 6, the second groove 61 is disposed on each of two opposite surfaces. As shown in FIG. 9, the second groove 61 is disposed on one surface of the second support 6, and a thermally conductive material is disposed in the second groove 61.

The second groove 61 is disposed on the at least one surface of the second support 6, and the second groove 61 is filled with the thermally conductive material, to further improve heat transfer efficiency of the second support 6, and reduce heat transferred from the first support 4 to the housing 5, so as to further reduce a temperature at the part corresponding to the heat generation element 2 in the housing 5, to improve user experience.

When the second support 6 is disposed, in the housing 5, a region touched by the user at relatively low frequency is selected, and a position at which the second support 6 is disposed corresponds to the region with relatively low touch frequency, to reduce impact of dissipation of the heat from the heat generation element 2 on use of the user.

Figure 10:
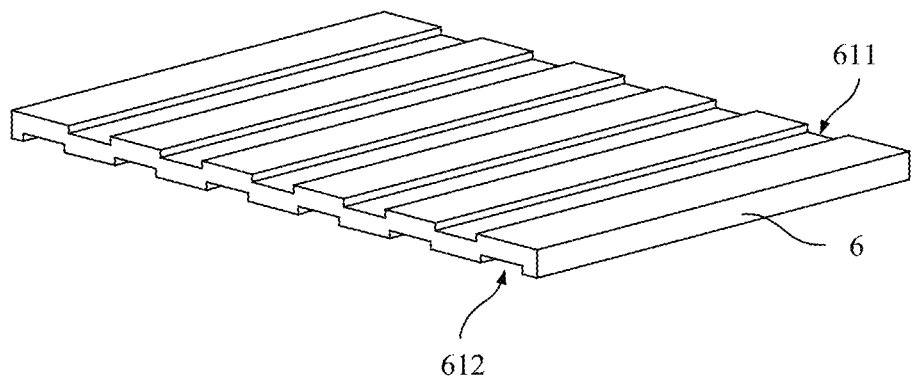
FIG. 10 is a schematic diagram of a structure of another second support according to an embodiment of this application.

FIG. 10 is a schematic diagram of a structure of another second support according to an embodiment of this application. As shown in FIG. 8 to FIG. 10, in some embodiments, the second groove 61 includes a third sub-groove 611 and a fourth sub-groove 612, the third sub-groove 611 is disposed on a side that is of the second support 6 and that faces the heat dissipation layer 3, and the fourth sub-groove 612 is disposed on a side that is of the second support 6 and that faces away from the heat dissipation layer 3. A thermally conductive material is disposed in each of the third sub-groove 611 and the fourth sub-groove 612.

Figure 11:
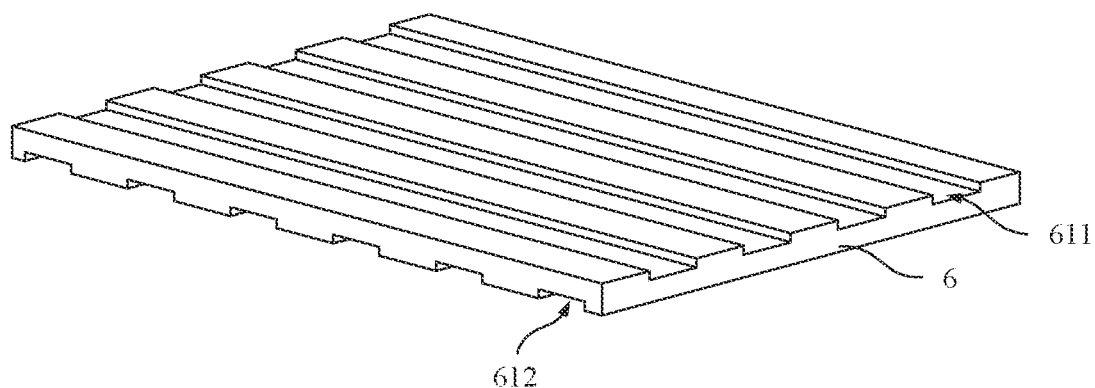
FIG. 11 is a schematic diagram of a structure of still another second support according to an embodiment of this application.

The third sub-groove 611 and the fourth sub-groove may be disposed in a staggered manner, or may be crosswise disposed. As shown in FIG. 10, the third sub-groove 611 and the fourth sub-groove 612 are disposed in the staggered manner. As shown in FIG. 11, an orthographic projection of the third sub-groove 611 on the housing 5 and an orthographic projection of the fourth sub-groove 612 on the housing 5 are crosswise arranged, to crosswise dispose the third sub-groove 611 and the fourth sub-groove 612.

The thermally conductive material is disposed in the third sub-groove 611, to improve efficiency of transferring heat from the heat dissipation layer 3 to the second support 6, and the thermally conductive material is disposed in the fourth sub-groove 612, to improve efficiency of transferring heat from the second support 6 to the housing 5. Therefore, the thermally conductive material is disposed in each of the third sub-groove 611 and the fourth sub-groove 612, so that the efficiency of transferring heat from the heat dissipation layer 3 to the housing 5 is effectively improved, and heat at a position at the heat dissipation layer 3 corresponding to the heat generation element 2 is further dissipated, to reduce the temperature at the part corresponding to the heat generation element 2 in the housing 5.

The thermally conductive material may be made of one or more of thermal adhesive, copper foil, and graphite.

The second support 6 and the thermally conductive material may be integrally formed by using a dual-shot injection molding process, or the second groove 61 may be filled with the thermally conductive material after the second support 6 is manufactured.

In some embodiments, each of the first support 4 and the second support 6 is of an integrated structure.

Each of the first support 4 and the second support 6 is a support configured to support and protect the electronic component in the mobile terminal. Therefore, each of the first support 4 and the second support 6 is of an integrated structure or a split structure, and a choice may be made based on a specific structure in the mobile terminal. This is not limited herein.

The foregoing descriptions are merely preferred embodiments of this application, and are not intended to limit this application. For a person skilled in the art, this application may have various modifications and variations. Any modification, equivalent replacement, or improvement made without departing from the spirit and principle of this application shall fall within the protection scope of this application.

What is claimed is:

1. A mobile terminal comprising:
a housing;
a main board;
a heat generation element disposed on the main board;
a heat dissipation layer in contact with the heat generation element;
a first support in contact with the heat dissipation layer opposite the heat generation element, wherein the first support comprises a first groove; and
a second support affixed to a side of the heat dissipation layer that is opposite the heat generation element and comprising:
a third surface that faces the heat dissipation layer;

a fourth surface that faces away from the heat dissipation layer;

a second groove disposed on either the third surface or the fourth surface; and a thermally conductive material disposed in the second groove, wherein the main board, the heat generation element, the heat dissipation layer, and the first support are sequentially stacked in a plane parallel to a surface of the housing, wherein the heat generation element is smaller in area than the first support, wherein the heat generation element overlaps the first support, and wherein the heat dissipation layer is larger in area than the heat generation element.

2. The mobile terminal of claim 1, wherein the first groove further comprises a plurality of first grooves disposed on a first surface and/or a second surface of the first support, wherein every two adjacent first grooves of the plurality of first grooves are disposed in parallel, and wherein the first surface faces the heat dissipation layer, and the second surface faces away from the heat dissipation layer.

3. The mobile terminal of claim 2, wherein each of the plurality of first grooves comprises:

a first sub-groove disposed on the first surface of the first support; and a second sub-groove disposed on the second surface of the first support, and wherein the first sub-groove and the second sub-groove are disposed in a staggered manner.

4. The mobile terminal of claim 3, further comprising a heat insulation material disposed in the plurality of first grooves.

5. The mobile terminal of claim 2, wherein each of the plurality of first grooves comprises:

a first sub-groove disposed on the first surface of the first support; and a second sub-groove disposed on the second surface of the first support and crosswise with respect to the first sub-groove.

6. The mobile terminal of claim 5, further comprising a heat insulation material disposed in the plurality of first grooves.

7. The mobile terminal of claim 2, further comprising a heat insulation material disposed in the plurality of first grooves.

8. The mobile terminal of claim 1, further comprising a heat insulation material disposed in the first groove.

9. The mobile terminal of claim 1, wherein the thermally conductive material comprises at least one of a thermal adhesive, a copper foil, or graphite.

10. The mobile terminal of claim 1, wherein the second support and the thermally conductive material comprise an integral injection molding.

11. The mobile terminal of claim 1, wherein each of the first support and the second support is an integrated structure.

12. The mobile terminal of claim 1, wherein the heat dissipation layer comprises at least one of graphite or a silica gel.

13. The mobile terminal of claim 1, wherein a part of the heat dissipation layer that is non-adjacent to the first support is directly coupled to the housing.

14. The mobile terminal of claim 1, wherein the first groove comprises a plurality of first grooves disposed on a first surface of the first support, wherein every two adjacent first grooves of the plurality of first grooves are disposed in parallel, and wherein the first surface of the first support faces the heat dissipation layer.

15. The mobile terminal of claim 1, wherein the first groove comprises a plurality of first grooves disposed on a second surface of the first support, wherein every two adjacent first grooves of the plurality of first grooves are disposed in parallel, and wherein the second surface of the first support faces away from the heat dissipation layer.

16. The mobile terminal of claim 15, further comprising a heat insulation material disposed in the plurality of first grooves.

17. The mobile terminal of claim 1, wherein the first groove is further disposed to reduce heat transfer efficiency between the heat generation element and a part corresponding to the heat generation element in the housing.

18. The mobile terminal of claim 1, wherein a part of the heat dissipation layer that is nonadjacent to the first support is indirectly coupled to the housing.

19. The mobile terminal of claim 1, wherein the second groove further comprises a plurality of second grooves disposed on a side of the second support that faces the heat dissipation layer and on a side of the second support that faces away from the heat dissipation layer.

20. The mobile terminal of claim 19, wherein a thermally conductive material is disposed in each of the plurality of second grooves.

* * * * *